(12) United States Patent
Schaller et al.

(10) Patent No.: US 11,355,367 B2
(45) Date of Patent: Jun. 7, 2022

(54) ROBOT FOR SIMULTANEOUS SUBSTRATE TRANSFER

(71) Applicant: Applied Materials, Inc., Santa Clara, CA (US)

(72) Inventors: Jason M. Schaller, Austin, TX (US); Charles T. Carlson, Austin, TX (US); Luke Bonecutter, Cedar Park, TX (US); David Blahnik, Round Rock, TX (US); Karuppasamy Muthukamatchi, Bangalore (IN); Jeff Hudgens, San Francisco, CA (US); Benjamin Riordon, Newburyport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/922,536

(22) Filed: Jul. 7, 2020

(65) Prior Publication Data
US 2021/0013068 A1 Jan. 14, 2021

Related U.S. Application Data

(60) Provisional application No. 62/873,432, filed on Jul. 12, 2019.

(51) Int. Cl.
*H01L 21/67* (2006.01)
*B65G 47/90* (2006.01)
(Continued)

(52) U.S. Cl.
CPC ...... *H01L 21/67196* (2013.01); *B65G 47/907* (2013.01); *H01L 21/68* (2013.01); *H01L 21/68707* (2013.01); *H01L 21/67167* (2013.01)

(58) Field of Classification Search
None
See application file for complete search history.

(56) References Cited

U.S. PATENT DOCUMENTS

| 5,513,948 A | 5/1996 | Bacchi et al. |
| 5,667,592 A | 9/1997 | Boitnott et al. |

(Continued)

FOREIGN PATENT DOCUMENTS

| CN | 1909182 A | 2/2007 |
| CN | 107342243 A | 11/2017 |

(Continued)

OTHER PUBLICATIONS

International Search Report and Written Opinion dated Oct. 23, 2020 in International Patent Application No. PCT/US2020/041156, 9 pages.

(Continued)

*Primary Examiner* — Ronald P Jarrett
(74) *Attorney, Agent, or Firm* — Kilpatrick Townsend & Stockton LLP

(57) ABSTRACT

Exemplary substrate processing systems may include a transfer region housing defining a transfer region, and including substrate supports and a transfer apparatus. The transfer apparatus may include a central hub having a housing, and including a first shaft and a second shaft. The housing may be coupled with the second shaft, and may define an internal housing volume. The transfer apparatus may include a plurality of arms equal to a number of substrate supports of the plurality of substrate supports. Each arm of the plurality of arms may be coupled about an exterior of the housing. The transfer apparatus may include a plurality of arm hubs disposed within the internal housing volume. Each arm hub of the plurality of arm hubs may be coupled with an arm of the plurality of arms through the housing. The arm hubs may be coupled with the first shaft of the central hub.

20 Claims, 11 Drawing Sheets

(51) Int. Cl.
  *H01L 21/687* (2006.01)
  *H01L 21/68* (2006.01)

(56) References Cited

U.S. PATENT DOCUMENTS

| | | | |
|---|---|---|---|
| 5,855,465 | A | 1/1999 | Boitnott et al. |
| 6,293,746 | B1 | 9/2001 | Ogawa |
| 6,962,644 | B2 | 11/2005 | Paterson et al. |
| 7,516,833 | B2 | 4/2009 | Todaka |
| 9,184,072 | B2 | 11/2015 | Devine et al. |
| 9,299,598 | B2 | 3/2016 | Blank |
| 9,842,757 | B2 * | 12/2017 | Hosek .................. H01L 21/681 |
| 10,109,517 | B1 | 10/2018 | Blank et al. |
| 10,363,665 | B2 | 7/2019 | Hosek et al. |
| 2003/0082042 | A1 | 5/2003 | Woodruff et al. |
| 2004/0127142 | A1 | 7/2004 | Olgado |
| 2005/0031497 | A1 | 2/2005 | Siebert et al. |
| 2007/0031236 | A1 | 2/2007 | Chen |
| 2007/0034479 | A1 | 2/2007 | Todaka |
| 2007/0207014 | A1 | 9/2007 | Toshima |
| 2010/0294199 | A1 | 11/2010 | Tran et al. |
| 2013/0059440 | A1 | 3/2013 | Wang |
| 2013/0269609 | A1 | 10/2013 | Leeser |
| 2014/0154038 | A1 | 6/2014 | Hudgens et al. |
| 2014/0265090 | A1 * | 9/2014 | Hou .................. H01L 21/68785 269/14 |
| 2015/0063957 | A1 | 3/2015 | Olgado |
| 2016/0307782 | A1 | 10/2016 | Weaver et al. |
| 2016/0355927 | A1 | 12/2016 | Weaver et al. |
| 2017/0040203 | A1 | 2/2017 | Caveney et al. |
| 2017/0040204 | A1 | 2/2017 | Kim et al. |
| 2017/0306493 | A1 | 10/2017 | Raj et al. |
| 2018/0286728 | A1 | 10/2018 | Moura et al. |
| 2019/0164790 | A1 | 5/2019 | Liu |
| 2020/0094399 | A1 * | 3/2020 | Shindo ............. H01L 21/67742 |
| 2020/0402827 | A1 | 12/2020 | Uziel et al. |
| 2021/0013068 | A1 | 1/2021 | Schaller et al. |

FOREIGN PATENT DOCUMENTS

| | | |
|---|---|---|
| JP | H11-163075 A | 6/1999 |
| JP | 2007-049157 A | 2/2007 |
| JP | 4951201 B2 | 6/2012 |
| JP | 5463367 B2 | 4/2014 |
| KR | 10-0376963 B1 | 3/2003 |
| KR | 2007-0053538 A | 5/2007 |
| KR | 101394111 B1 | 5/2014 |
| KR | 2015-0101785 A | 9/2015 |
| KR | 10-1715887 B1 | 3/2017 |
| KR | 2019-0074481 A | 6/2019 |
| TW | 2011-39250 A | 11/2011 |
| TW | 2011-45448 A | 12/2011 |

OTHER PUBLICATIONS

International Search Report and Written Opinion mailed in International Patent Application No. PCT/US2020/040994, 10 pages.

International Search Report and Written Opinion dated Oct. 13, 2020 in International Patent Application No. PCT/US2020/041103, 7 pages.

International Search Report and Written Opinion dated Oct. 29, 2020 in International Patent Application No. PCT/US2020/041202, 10 pages.

International Search Report and Written Opinion dated Oct. 29, 2020 in International Patent Application No. PCT/US2020/041157, 11 pages.

International Search Report and Written Opinion dated Oct. 20, 2020 in International Patent Application No. PCT/US2020/041015, 11 pages.

* cited by examiner

ROBOT FOR SIMULTANEOUS SUBSTRATE TRANSFER

CROSS-REFERENCES TO RELATED APPLICATIONS

This application claims the benefit of priority of U.S. Provisional Patent Application No. 62/873,432, filed 12 Jul. 2019, the content of which is hereby incorporated by reference in its entirety for all purposes. The present technology is further related to the following applications, all concurrently filed 12 Jul. 2019, and titled: "ROBOT FOR SIMULTANEOUS SUBSTRATE TRANSFER" (U.S. Provisional Patent Application No. 62/873,400), "ROBOT FOR SIMULTANEOUS SUBSTRATE TRANSFER" (U.S. Provisional Patent Application No. 62/873,458), "ROBOT FOR SIMULTANEOUS SUBSTRATE TRANSFER" (U.S. Provisional Patent Application No. 62/873,480), "MULTI-LID STRUCTURE FOR SEMICONDUCTOR PROCESSING SYSTEMS" (U.S. Provisional Patent Application No. 62/873,518), and "HIGH-DENSITY SUBSTRATE PROCESSING SYSTEMS AND METHODS" (U.S. Provisional Patent Application No. 62/873,503). Each of these applications is hereby incorporated by reference in their entirety for all purposes.

TECHNICAL FIELD

The present technology relates to semiconductor processes and equipment. More specifically, the present technology relates to substrate processing systems.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Cluster tools often process a number of substrates by continuously passing substrates through a series of chambers and process operations. The process recipes and sequences will typically be programmed into a microprocessor controller that will direct, control, and monitor the processing of each substrate through the cluster tool. Once an entire cassette of wafers has been successfully processed through the cluster tool, the cassette may be passed to yet another cluster tool or stand-alone tool, such as a chemical mechanical polisher, for further processing.

Robots are typically used to transfer the wafers through the various processing and holding chambers. The amount of time required for each process and handling operation has a direct impact on the throughput of substrates per unit of time. Substrate throughput in a cluster tool may be directly related to the speed of the substrate handling robot positioned in a transfer chamber. As processing chamber configurations are further developed, conventional wafer transfer systems may be inadequate.

Thus, there is need for improved systems and methods that can be used to efficiently direct substrates within cluster tool environments. These and other needs are addressed by the present technology.

SUMMARY

Exemplary substrate processing systems may include a transfer region housing defining a transfer region. A sidewall of the transfer region housing may define a sealable access for providing and receiving substrates. The systems may include a plurality of substrate supports disposed within the transfer region. The systems may also include a transfer apparatus. The transfer apparatus may include a central hub including a first shaft and a second shaft extending about and concentric with the first shaft. The central hub may have a housing positioned within the transfer region and coupled with the second shaft. The housing may define an internal housing volume. The transfer apparatus may include a plurality of arms equal to a number of substrate supports of the plurality of substrate supports. Each arm of the plurality of arms may be coupled about an exterior of the housing. The transfer apparatus may include a plurality of arm hubs disposed within the internal housing volume. Each arm hub of the plurality of arm hubs may be coupled with an arm of the plurality of arms through the housing. The arm hubs may be coupled with the first shaft of the central hub.

In some embodiments, the plurality of substrate supports may include at least four substrate supports. The arm hubs may be distributed about a central axis of the central hub proximate a radial edge of the internal housing volume. The arm hubs may be independently rotatable from the housing with which the plurality of arms are coupled. The first shaft may extend within the internal housing volume. One or more linkages may couple each arm hub of the plurality of arm hubs with the first shaft within the internal housing volume. Rotation of the first shaft may be configured to rotate each arm hub of the plurality of arm hubs simultaneously. Each arm hub may be characterized by a central axis radially offset from the central axis of the central hub, and rotation of each arm hub of the plurality of arm hubs may be configured to rotate a corresponding arm of the plurality of arms about the central axis of an associated arm hub. The one or more linkages may include one or more belts extending about each arm hub of the plurality of arm hubs and the first shaft. The one or more linkages may include a plurality of gears coupled between the first shaft and the plurality of arm hubs, and each gear of the plurality of gears may be disposed between and in contact with both the first shaft and an arm hub of the plurality of arm hubs. Each substrate support of the plurality of substrate supports may include a set of lift pins accessible through the substrate support, and each set of lift pins may be characterized by a different vertical length than each other set of lift pins. The central hub may be vertically translatable along a central axis of the central hub. The transfer apparatus may also include a third shaft and a plurality of aligners. Each aligner may be positioned proximate a distal end of an associated arm of the plurality of arms. Each aligner may be independently rotatable from the plurality of arms and from the housing.

Some embodiments of the present technology may encompass methods of transferring a substrate. The methods may include receiving a substrate at a first substrate support within a transfer region of a substrate processing system. The substrate processing system may include a transfer apparatus including a central hub having a first shaft and a second shaft extending about and concentric with the first shaft. The central hub may have a housing. The transfer apparatus may include a plurality of arms, each arm of the plurality of arms coupled about an exterior of the housing. The transfer apparatus may include a plurality of arm hubs, each arm hub of the plurality of arm hubs coupled with an arm of the plurality of arms. The arm hubs may be coupled with the first shaft of the central hub. The methods may include engaging the substrate with an arm of the plurality of arms. The methods may include rotating the first shaft in a first direction about a central axis of the central hub. The methods may include rotating the second shaft in a second direction about the central axis of the central hub. The methods may include co-rotating the first shaft and the second shaft in the second direction about the central axis to reposition the substrate. The methods may include delivering the substrate to a second substrate support of the substrate processing system.

In some embodiments the methods may include transitioning the transfer apparatus by further rotating the second shaft in the second direction about the central axis and rotating the first shaft in the first direction about the central axis. The methods may include rotating the first shaft in the second direction about the central axis and rotating the second shaft in the first direction about the central axis. The methods may include, subsequent engaging the substrate, lifting the substrate from the first substrate support by translating the transfer apparatus vertically within the transfer region. The methods may include, subsequent engaging the substrate, recessing the first substrate support from the substrate. Each arm of the plurality of arms may include an aligner independently rotatable from the arm. The substrate may be seated on the aligner when the substrate is engaged by the arm of the plurality of arms. The transfer region may include at least four substrates, and engaging the substrates may include individually or simultaneously engaging the at least four substrates with the arms of the plurality of arms. The methods may include disengaging the at least four substrates, which may disengaging individually or simultaneously deposit the at least four substrates on associated substrate supports. The methods may include, prior to delivering the substrate to the second substrate support, delivering the substrate to an alignment hub positioned between the first substrate support and the second substrate support.

Some embodiments of the present technology may also encompass substrate processing systems, which may include a transfer region housing defining a transfer region. A sidewall of the transfer region housing may define a sealable access for providing and receiving substrates. The systems may include a plurality of substrate supports disposed within the transfer region. The systems may include a transfer apparatus. The transfer apparatus may include a central hub including a first shaft, a second shaft extending about and concentric with the first shaft, and a third shaft extending about and concentric with the second shaft. The central hub may have a housing positioned within the transfer region and coupled with the third shaft. The housing may define an internal housing volume. The transfer apparatus may include a plurality of arms, each arm of the plurality of arms coupled about an exterior of the housing at a proximal end of the arm. The transfer apparatus may include a plurality of arm hubs disposed within the internal housing volume, each arm hub of the plurality of arm hubs coupled with an arm of the plurality of arms through the housing. The arm hubs may be coupled with the first shaft of the central hub. The transfer apparatus may include a plurality of aligners, each aligner of the plurality of aligners coupled with an arm of the plurality of arms at a distal end of the arm. The transfer apparatus may include a plurality of aligner hubs disposed within the internal housing volume, each aligner hub of the plurality of aligner hubs concentric with an arm hub of the plurality of arm hubs. Each aligner hub of the plurality of aligner hubs may be coupled with an aligner of the plurality of aligners through the housing. The aligner hubs may be coupled with the second shaft of the central hub.

Such technology may provide numerous benefits over conventional systems and techniques. For example, the handling systems may provide increased transfer speeds compared to conventional designs. Additionally, the handling systems may accommodate transfer regions having multiple rows of substrates. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1A:
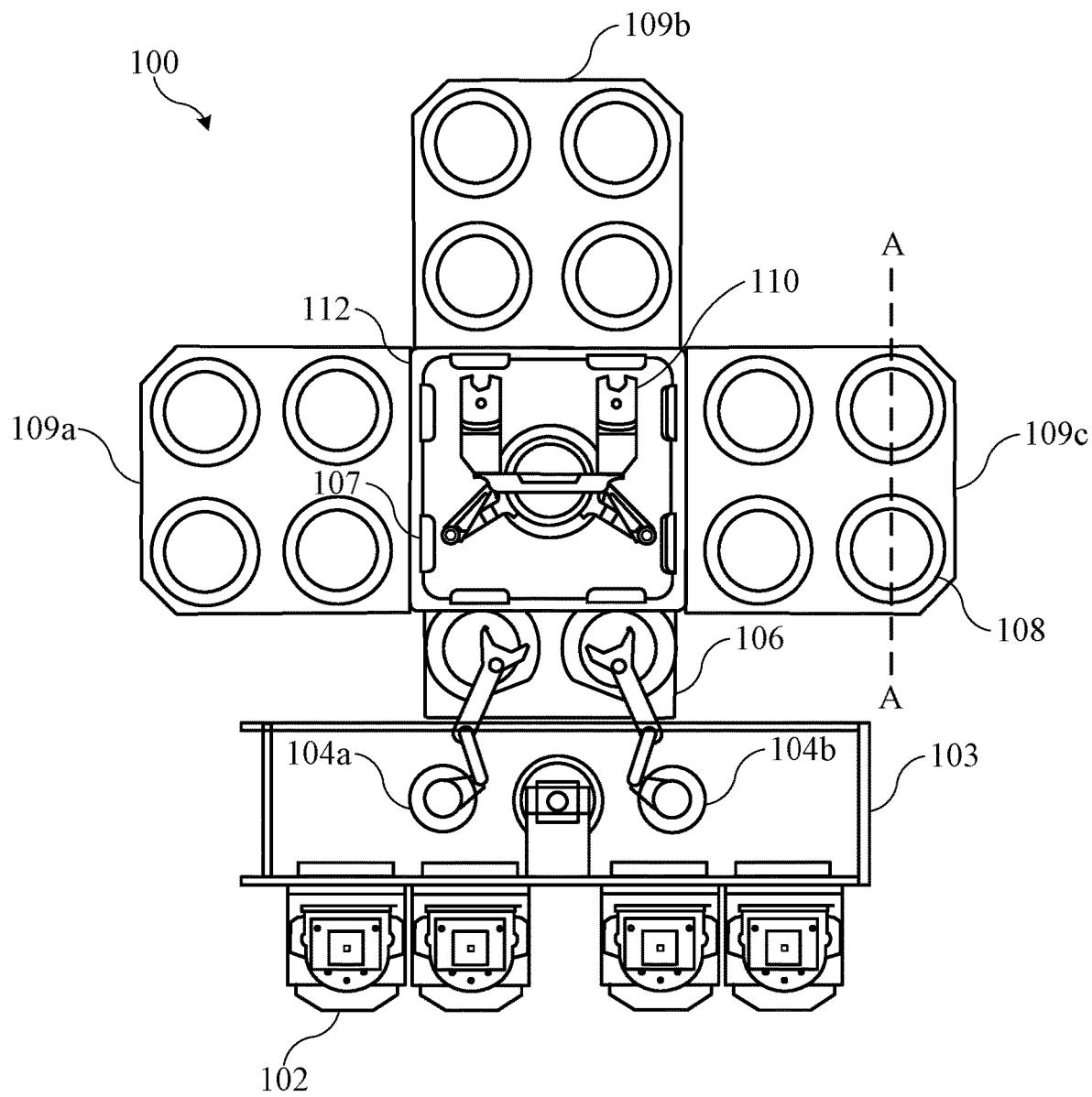
FIG. 1A shows a schematic top plan view of an exemplary processing system according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. The present technology may not use conventional wafer carriers in some embodiments, and may transfer specific wafers from one substrate support to a different substrate support within the transfer region. Although the remaining disclosure will routinely identify specific structures, such as four-position transfer regions, for which the present structures and methods may be employed, it will be readily understood that the systems and methods are equally applicable to any number of structures and devices that may benefit from the transfer capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104*a* and 104*b* and placed into a load lock or low pressure holding area 106 before being delivered to one of the substrate processing regions 108, positioned in chamber systems or quad sections 109*a-c*, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, preclean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109*a* and 109*b*, may be used to deposit material on the substrate, and the third set of processing chambers, such as the processing chambers or regions in quad section 109*c*, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 1B:
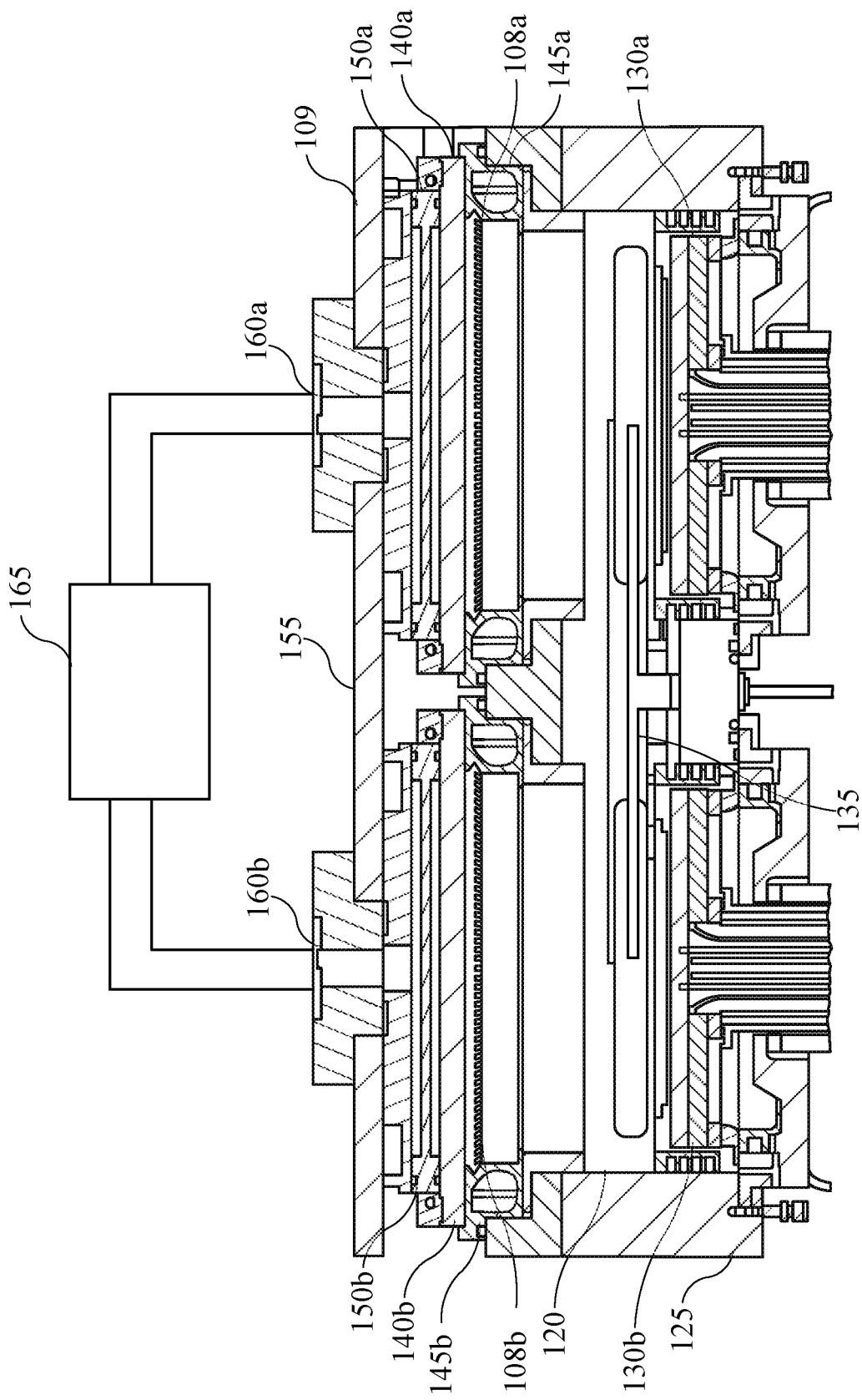
FIG. 1B shows a schematic partial cross-sectional view of an exemplary chamber system according to some embodiments of the present technology.

FIG. 1B shows a schematic cross-sectional elevation view of one embodiment of an exemplary processing tool, such as through a chamber system, according to some embodiments of the present technology. FIG. 1B may illustrate a cross-sectional view through any two adjacent processing regions 108 in any quad section 109, such as illustrated through line A-A in FIG. 1A. The elevation view may illustrate the configuration or fluid coupling of one or more processing regions 108 with a transfer region 120. For example, a continuous transfer region 120 may be defined by a transfer region housing 125. The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130a may deliver a substrate into processing region 108a, while substrate support 130b may deliver a substrate into processing region 108b. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140a may be included to define from above processing region 108a, and faceplate 140b may be included to define from above processing region 108b. In some embodiments the substrate support may operate as the companion electrode for generating a capacitively-coupled plasma between the faceplate and the substrate support. A pumping liner 145 may at least partially define the processing region 108 radially, or laterally depending on the volume geometry. Again, separate pumping liners may be utilized for each processing region. For example, pumping liner 145a may at least partially radially define processing region 108a, and pumping liner 145b may at least partially radially define processing region 108b. A blocker plate 150 may be positioned between a lid 155 and the faceplate 140 in embodiments, and again separate blocker plates may be included to facilitate fluid distribution within each processing region. For example, blocker plate 150a may be included for distribution towards processing region 108a, and blocker plate 150b may be included for distribution towards processing region 108b.

Lid 155 may be a separate component for each processing region, or may include one or more common aspects. In some embodiments, such as illustrated, lid 155 may be a single component defining multiple apertures 160 for fluid delivery to individual processing regions. For example, lid 155 may define a first aperture 160a for fluid delivery to processing region 108a, and lid 155 may define a second aperture 160b for fluid delivery to processing region 108b. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

Figure 2:
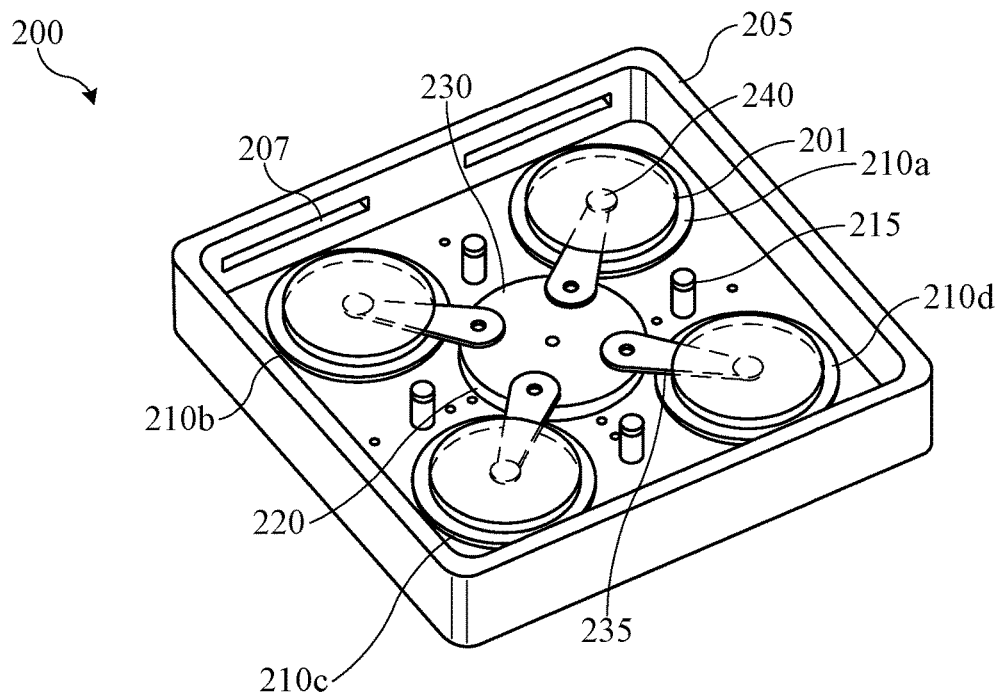
FIG. 2 shows a schematic perspective view of a transfer region of an exemplary chamber system according to some embodiments of the present technology.

As noted, processing system 100, or more specifically quad sections or chamber systems incorporated with system 100 or other processing systems, may include transfer sections positioned below the processing chamber regions illustrated. FIG. 2 shows a schematic isometric view of an exemplary chamber system 200 according to some embodiments of the present technology. The system illustrated may include a transfer region housing 205 defining an internal volume or transfer region in which a number of components may be included. The transfer region may additionally be at least partially defined from above by processing chambers, such as processing chambers illustrated in quad sections 109 of FIG. 1A. A sidewall of the transfer region housing may define one or more access locations 207 through which substrates may be delivered and retrieved, such as by second robotic arm 110 as discussed above. Access locations 207 may be slit valves or other sealable access positions, which may include doors or other sealing mechanisms to provide a hermetic environment within transfer region housing 205 in some embodiments. Although illustrated with two such access locations 207, it is to be understood that in some embodiments only a single access location 207 may be included. It is also to be understood that substrate processing system 200 may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210*a* or 210*b* through the accesses 207, and may deliver substrates directly to a transfer apparatus within the transfer region in some embodiments. Similarly, second robotic arm 110 may retrieve substrates from these locations. Lift pins may protrude from the substrate supports 210, or be accessible through the substrate supports, as will be discussed below, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chambers, such as processing chambers 108, positioned above the transfer region housing 205.

The transfer region housing 205 may provide access for alignment systems 215, which may include an aligner that can extend through an aperture of the transfer region as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. Although exemplary operations will be described below, in one example, transfer apparatus 220 may move substrates on substrate supports 210*a* and 210*b* to substrate supports 210*c* and 210*d*, which may allow additional substrates to be delivered into the transfer region.

Transfer apparatus 220 may include a central hub 225 that may include one or more shafts extending into the transfer region. The central hub 225 may include a housing 230 positioned centrally or otherwise within the transfer region housing 205. Housing 230 may define an internal housing volume as will be described below, and within which may be disposed additional components associated with the transfer apparatus 220. Housing 230 may be decoupled from a base of transfer region housing 205, which may allow rotation of housing 230 within the transfer region. Coupled with the central hub may be a plurality of arms 235. The arms 235 may be coupled at radially outer positions about the housing 230, although in embodiments the arms may be coupled closer towards a central axis of the central hub. By disposing the arms radially outward, associated hub and linkage components may be incorporated more freely within the housing as will be illustrated below. The arms 235 may extend from an exterior of the housing, and although the arms may be fixedly coupled with the housing, in some embodiments the arms may be coupled with hubs or an extension of a hub extending through the housing. This may allow an additional degree of rotation of the transfer apparatus facilitating independent rotation of the arms 235 relative to the housing 230.

Any number of arms 235 may be included in embodiments of the present technology. In some embodiments a number of arms 235 may be similar or equal to the number of substrate supports 210 included in the chamber. Hence, as illustrated, for four substrate supports, transfer apparatus 220 may include four arms extending laterally or radially outward from the housing of the central hub. The arms may be characterized by any number of shapes and profiles, such as straight profiles as illustrated, as well as arcuate profiles, or different distal position shapes as will be discussed further below. As will be explained further below, the arms may be extendable below one or more substrates 201, and may be used to individually adjust one or more of the substrates, as well as transfer substrates 201 to alternate substrate supports within the transfer region.

The arms as well as the housing and other components of the transfer apparatus may be made from or include a number of materials including conductive and/or insulative materials. The materials may be coated or plated in some embodiments to withstand contact with precursors or other chemicals that may pass into the transfer region from an overlying processing chamber. The materials may also be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher.

Any of these temperatures may be maintained during operations, and thus components of the transfer apparatus 220 may be exposed to any of these stated or encompassed temperatures, including arms 235, which may extend between a substrate support 210 and a substrate 201. Consequently, in some embodiments any of the materials may be selected to accommodate these temperature regimes, and may include materials such as ceramics and metals that may be characterized by relatively low coefficients of thermal expansion, or other beneficial characteristics. Component couplings may also be adapted for operation in high temperature and/or corrosive environments. For example, in some embodiments, where arms and hubs may each be ceramic, the coupling may include press fittings, snap fittings, or other fittings that may not include additional materials, such as bolts, which may expand and contract with temperature, and may cause cracking in the ceramics, although in some embodiments any number of fittings may be used with the components.

Some embodiments of transfer apparatus 220 may also include aligners 240 coupled with the arms 235 about or near a distal end of the arms relative to a proximal connection relative to housing 230. As will be discussed further below, aligners 240 may provide a third aspect of rotation for substrates being positioned or repositioned during transfer or other operations. In some embodiments the aligners may extended directly in line between a substrate support and a substrate, which may expose the aligner and associated components, including linkages, to the substrate support temperature. Accordingly, these materials may similarly be selected to accommodate the environmental conditions to which the materials may be exposed. Any number of other materials may be utilized that may facilitate operation or resistance during operation, and are similarly encompassed by the present technology.

Figures 3A, 3B:
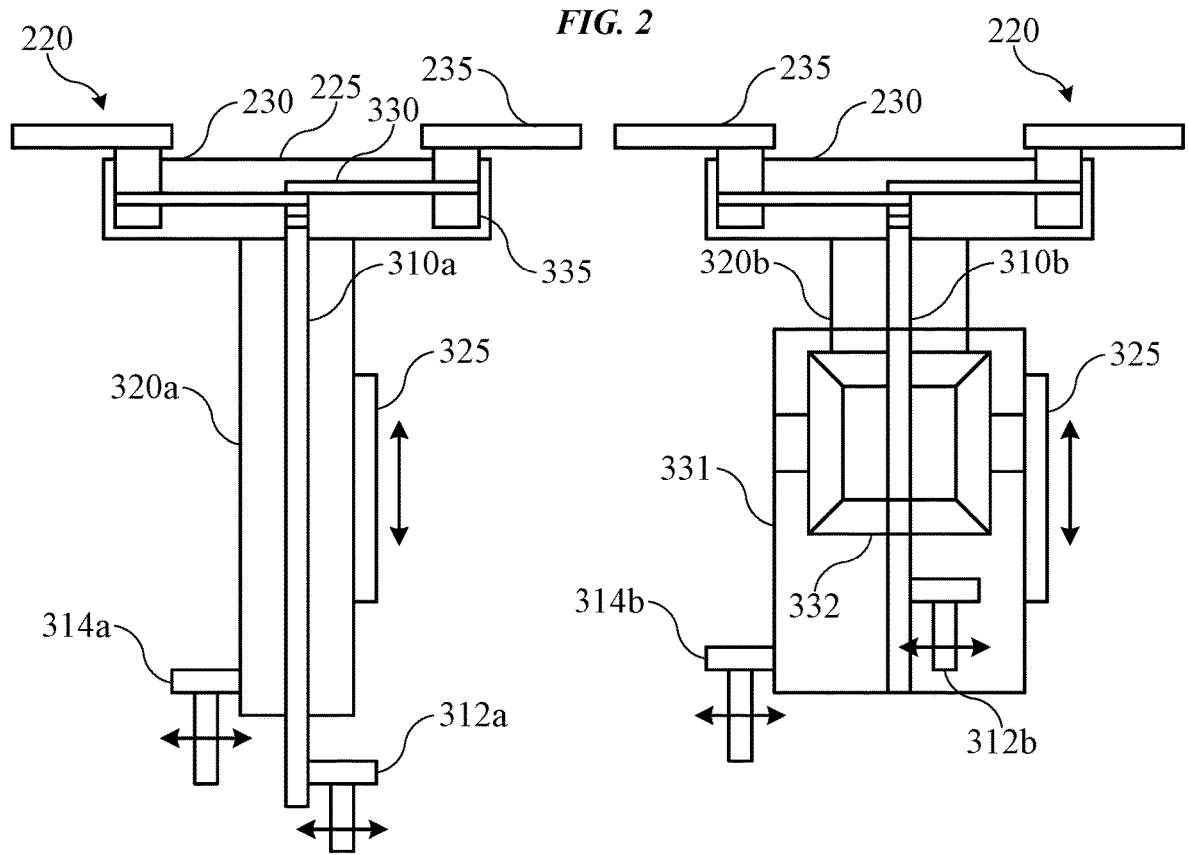
FIGS. 3A-3B show schematic cross-sectional views of exemplary transfer apparatuses according to some embodiments of the present technology.

The transfer apparatus 220 may include a number of components and configurations that may facilitate the movement of the arms independently from the housing as will be described further below. FIGS. 3A-3B show schematic cross-sectional views of exemplary transfer apparatus 220 according to some embodiments of the present technology, although it is to be understood that any other configurations affording the independent rotational movement to be described are similarly encompassed by the present technology.

Central hub 225 may include a first shaft 310 and a second shaft 320, which may be axially aligned with first shaft 310. For example, first shaft 310 and second shaft 320 may be concentric about a central axis extending vertically through the central hub. In some embodiments first shaft 310 may extend through second shaft 320, or aspects of second shaft 320. As illustrated in FIG. 3A, first shaft 310 and second shaft 320 may be coaxial, although the two shafts may be coupled with separate motor or drive systems. As illustrated, first shaft 310*a* may be coupled with a first drive system 312*a*, which may include a motor, and which may allow rotation about the central axis. This rotation may rotate linkages 330 in a first direction, or in a second direction opposite the first, the movement of which may rotate arm hubs 335 in a first direction about a central axis through each arm hub, or in a second direction opposite the first. Similarly, second shaft 320*a* may be coupled with a second drive system 314*a*, which may independently allow rotation of housing 230 in a first direction or a second direction about the central axis. In some embodiments a vertical translation drive 325 may be included, which may allow the transfer apparatus to be vertically translated along the central axis. This may facilitate lifting substrates from substrate supports or lift pins in some embodiments, although in some embodiments the lift pins and/or substrate supports may be used to raise and lower substrates, and transfer apparatus 220 may not include a vertical drive mechanism.

Illustrated internally within a volume defined by housing 230 may be one or more arm hubs 335, including a plurality of arm hubs. The arm hubs may be disposed at least partially within the housing, and may extend through housing 230 to couple with arms 235, or may include an extension post or linkage to couple with arms 235. Each arm of the plurality of arms 235 may include a corresponding or associated arm hub 335 facilitating rotation of the arms independently from rotation of housing 230. The arm hubs 335 may be coupled individually or collectively with first shaft 310 of the central hub, and which may allow rotation of the arm hubs 335 when first shaft 310 is rotated. Arm hubs 335 may be distributed about the central axis of the central hub, and may be radially offset from the central axis. Each arm hub may be characterized by a corresponding arm hub axis extending through the arm hub and defining an axis of rotation for an associated arm coupled to or with the hub.

The arm hubs 335 may be positioned near a radial or lateral edge of the internal volume of housing 230, which may limit interference between adjacent hubs when the number of hubs and arms is increased for transfer regions including additional substrate supports, for example. Arm hubs 335 may not be directly coupled with housing 230, or may be rotatably coupled with the housing, which may facilitate independent rotation between the arm hubs and the housing, which may produce multiple rotational aspects for the transfer apparatus 220. First shaft 310 may extend within the internal housing, and may provide an amount of access for coupling linkages 330 about the first shaft. As shown, the linkages may individually or collectively couple each arm hub of the plurality of arm hubs 335 with the first shaft 310 within the internal housing volume. Consequently, when the first shaft 310 is rotated by first drive system 312*a*, the linkages coupling the shaft with the arm hubs may cause the hubs to similarly rotate, and may cause the arm hubs to rotate simultaneously about individual hub central axes offset radially from the central axis of the transfer apparatus or central hub as noted above. As the arm hubs rotate with rotation of first shaft 310, arms 235 may also rotate in a direction corresponding to or associated with a direction of rotation of the first shaft 310 and/or arm hubs 335.

FIG. 3B illustrates another embodiment of transfer apparatus 220 which may utilize a gear box to facilitate counter rotation of the first shaft 310*b* relative to the second shaft 320*b*. For example, second shaft 320*b* may be coupled with a gear box 331 including a gear set 332 having a first gear coupled with the first shaft 310*b*. As would be readily understood, driving the first gear in a first direction with first drive system 312*b* would produce a counter rotation in the opposite gear, which may be coupled with second shaft 320*b* and housing 230. Additionally, a second drive system 314*b* may be coupled with the components to rotate the gear box and first shaft together, which would facilitate co-rotation of the housing 230 and the arms 235, although due to rotation ratio differences between the arms and the housing, further rotation of first shaft 310*b* may also occur, although the first shaft 310*b* and second shaft 320*b* may be rotated in similar directions. The figure also shows the optional vertical translation drive 325, which may linearly move the transfer apparatus up or down as described above. It is to be understood that FIGS. 3A-3B are merely illustrative of any number of configurations and components that may be used to independently rotate the first shaft and second shaft affording separate control of the housing and arms. Consequently, in some embodiments the first shaft and second shaft may be co-rotated about the central axis either at similar or different rotational speeds, or the two shafts may be counter-rotated with respect to the other shaft, again either at similar or different rotational speeds. This operation will be described in more detail below.

Figure 3C:
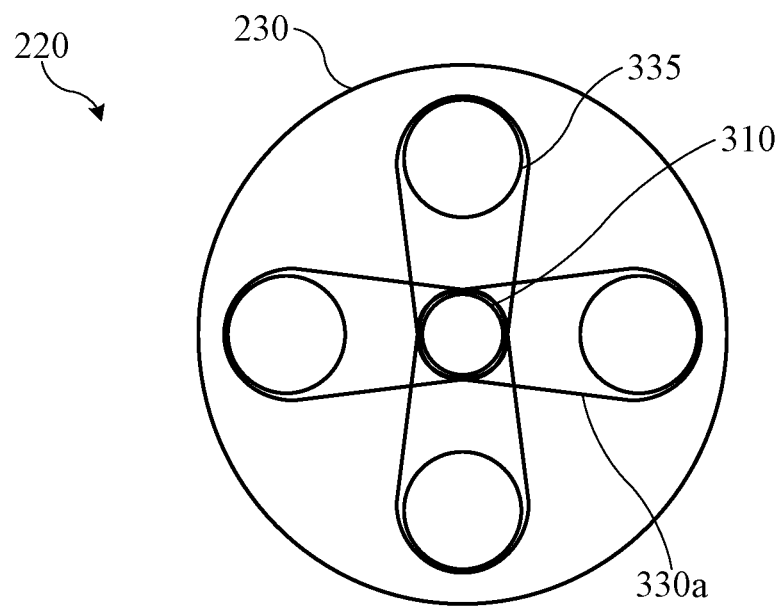
FIGS. 3C-3D show schematic top plan views of exemplary transfer apparatus components according to some embodiments of the present technology.
Figure 3D:
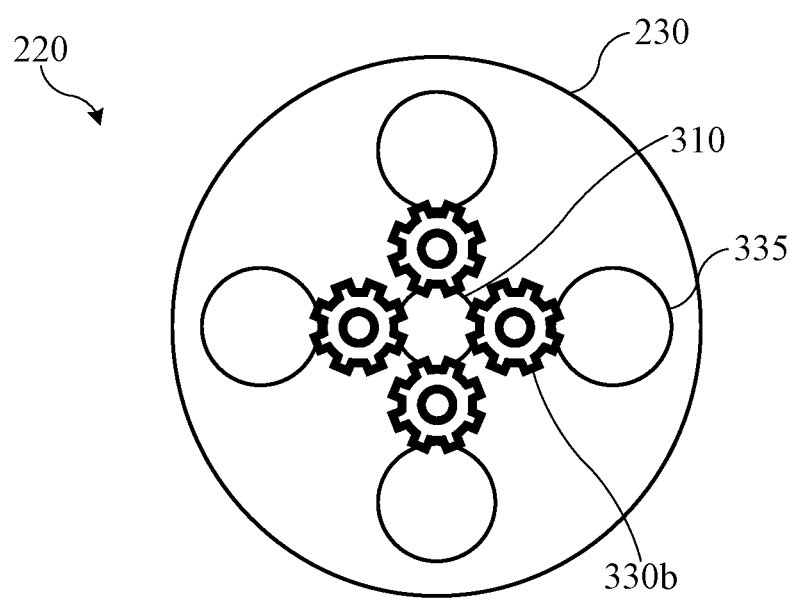

FIGS. 3C-3D show schematic top plan views of exemplary components of transfer apparatus 220 according to some embodiments of the present technology. Although only some aspects of a transfer apparatus as previously described may be illustrated, it is to be understood the illustrations are not intended to be limiting and may include any of the components, materials, or characteristics of transfer apparatus 220 described previously. Additionally, the figures may illustrate linkages included with any of the previously described transfer apparatuses or embodiments of the present technology.

As illustrated, transfer apparatus 220 may include a housing 230. Although housing 230 may include a covered lid portion as illustrated previously, the lid is not shown in the illustration to facilitate exemplary linkages encompassed by the present technology. First shaft 310 may extend within housing 230, and may be coupled with arm hubs 335 as previously described. Although only four arm hubs 335 are illustrated, it is to be understood that any number of hubs may be included to accommodate any number of associated arms. Linkages 330a are illustrated in one embodiment in which one or more belt couplings may be used and may extend about individual arm hubs 335 as well as first shaft 310 in a number of ways. The belts may extend within grooves or trenches defined in each of the arm hubs and first shaft. For example, four separate trenches may be defined vertically along first shaft 310 to accommodate each belt, and ensure the belts are maintained offset to limit or prevent contact or interaction of the belts. Similarly, grooves or trenches may be defined about each arm hub to maintain a set position of the belts.

Although a set of belts is illustrated in the figure, a single belt, such as a serpentine belt or drive belt, may be extended about each arm hub and the first shaft 310 to provide the coupling. Additionally, twisted belts may be incorporated to reverse rotations between components. Individual or multiple belts may be used in different embodiments, although additional linkage systems may similarly be used. For example, as illustrated in FIG. 3D, a gear set may be used to drive the arm hubs as illustrated. For example, first shaft 310 may define a number of gear teeth along a region extending within housing 230. The gear teeth may be interconnected with teeth of a linkage gear 330b for each arm hub 335 of the transfer apparatus. Each gear of the plurality of gears may be positioned in contact with one or both of the first shaft 310 as well as an associated arm hub 335 as illustrated. Additional gears may also be incorporated in any number of configurations to facilitate rotation of the arm hubs from rotation of the first shaft 310. Again, although only four such arm hubs and linkage gears are illustrated, any number of linkages and hubs may be included in encompassed embodiments of the present technology. Similarly, FIGS. 3C and 3D illustrate two possible linkage systems encompassed by the present technology, and the illustrations are not intended to be limiting.

Any number of other system component couplings configured to provide the described operations are similarly encompassed by the present technology. Moreover, because the linkage connections may include a number of gears, twisted belts, and other components that may cause arm hubs 335 to rotate in a similar direction as first shaft 310 or a different direction, it is to be understood that any embodiment described throughout the present disclosure may consider this effect. For example, a first direction of shaft rotation may cause an associated arm hub to rotate in either direction, and thus when first and second directions are described, either direction may actually be encompassed to accommodate the movement illustrated or described, and which may account for any type of actual linkage coupling encompassed in any individual example.

Figure 4:
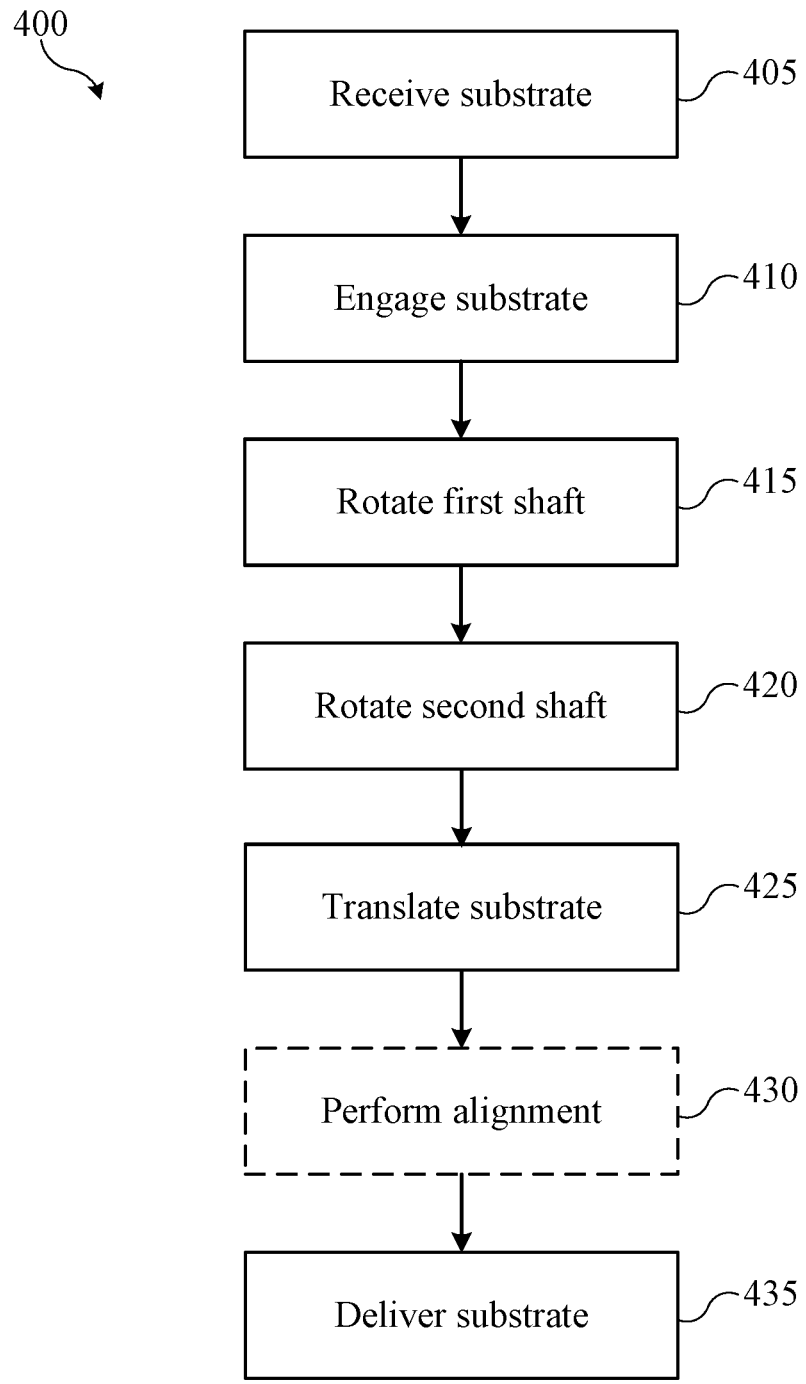
FIG. 4 shows exemplary operations in a method of transferring substrates according to some embodiments of the present technology.

FIG. 4 shows exemplary operations in a method 400 of transferring a substrate according to some embodiments of the present technology. Method 400 may be performed in one or more transfer systems, such as system 200, which may be incorporated into processing system 100, for example. The method may include a number of optional operations as denoted in the figure, which may or may not be specifically associated with some embodiments of methods according to the present technology. Method 400 describes operations shown schematically in FIGS. 5A-5I, the illustrations of which will be described in conjunction with the operations of method 400. It is to be understood that FIG. 5 illustrates only partial schematic views with limited details, and in some embodiments the systems may include more or less substrate supports and other components, as well as alternative structural aspects that may still benefit from any of the aspects of the present technology.

Figure 5A:
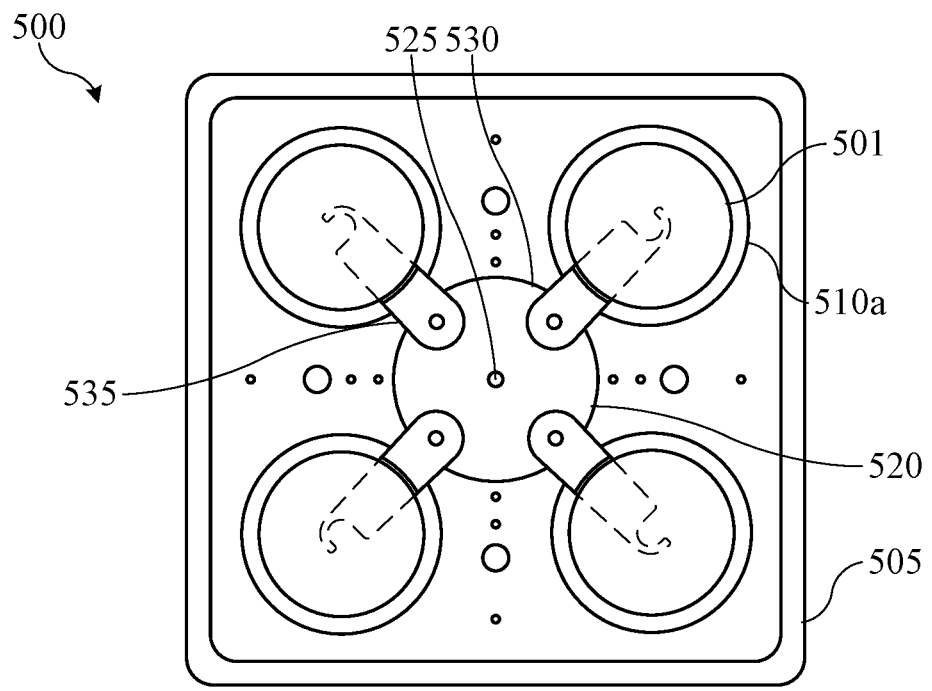
FIGS. 5A-5H show schematic top plan views of substrates being transferred according to some embodiments of the present technology.

FIG. 5A may illustrate a transfer region of a substrate processing system 500 as previously described, and may include any of the features and aspects of system 200 described above, including any of the drive components discussed previously with FIG. 3, as well as any other drive components as would be understood are similarly encompassed by the present technology. Additionally, system 500 may be illustrated with a number of substrates 501 disposed within the chamber, such as seated on substrate supports 510 as illustrated. The figure may show a configuration of the present technology subsequent initial operations of method 400, which may include receiving a substrate at a first substrate support 510a at operation 405, such as through an access with a robot as previously described. The robot may deliver one or two, or more, substrates into the transfer region 505 onto the substrate supports proximate the accesses or slit valves. Transfer apparatus 520 may rotate the two substrates to the opposite substrate supports, and two additional substrates may be delivered. It is to be understood that the same process can be performed with any number of substrates, including delivery of one substrate at a time into the processing chamber. FIG. 5A may illustrate after four substrates have been positioned within the transfer region. Additionally, during delivery of substrates or subsequent transfer, transfer apparatus 520 may be positioned in a recessed configuration, which may be, for example, coiled proximate the housing 530 of central hub 525, or extended between substrate supports 510. When a transfer operation is to be initiated for any number of substrates, the transfer apparatus may perform one or more adjustments to extend arms 535 at least partially beneath substrates 501 as illustrated. These motions or adjustments may include any of the rotations as described below, as well as additional rotations or movements to accommodate the components within the transfer region.

A transfer process may involve rotating the transfer apparatus in a number of ways. Method 400 may include engaging the substrates 501 at operation 410. The engagement may occur simultaneously or individually until one or more substrates have been transferred from substrate supports 510, including lift pins of the substrate supports, to arms 535 of transfer apparatus 520. Depending on the transfer apparatus having vertical movement capabilities or not, the engagement and movement may or may not include raising or lowering one or both of the substrates or the transfer apparatus. Once the substrates have been engaged by the transfer apparatus, a complete transfer of the substrate or substrates may be made between the substrate supports and the transfer apparatus. For example, in some embodiments the transfer apparatus may lift the substrates from the substrate supports or lift pins on which the substrates may be seated. This may be performed by vertically translating the transfer apparatus, for example. In some embodiments, the substrate supports may recess away from the substrate or substrates to complete the transfer.

Figure 5B:
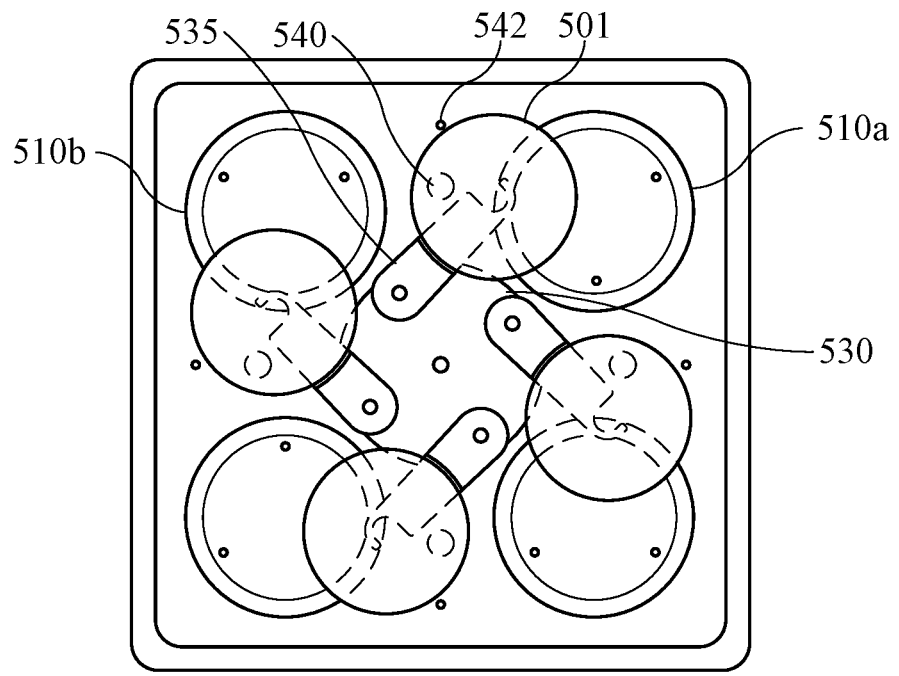

After the transfer is complete to the transfer apparatus, the substrates may be rotated between the substrate supports for further processing in different chambers, or to deliver the substrates to substrate supports accessible by a transfer robot, such as second robotic arm 110 described above. Translation of the substrate or substrates may occur by causing one or more rotations of the first shaft and the second shaft, which may cause rotation of the arms and the housing, and as illustrated in FIG. 5B. Although the figure illustrates a counterclockwise rotation, it is to be understood that the substrates can be rotated in either direction about the central axis in embodiments.

To initiate translation of the substrates after the substrates are positioned on the arms 535 of the transfer apparatus, the method may include rotating the first shaft of the central hub in a first direction about a central axis of the central hub at operation 415. Previously, subsequently, or concurrently, the method may include rotating the second shaft in a second direction about the central axis of the second hub at operation 420. The second direction may be the opposite rotation of the first direction as previously described. As illustrated in FIG. 5B, this counter rotation may facilitate recessing the substrates 501 towards the central hub 525 during translation, as the arms 535 are rotated back towards the housing 530. Although not intended to be limiting, the illustrated rotation may be showing aspects of translating substrate 501 from first substrate support 510*a* to second substrate support 510*b*. To provide this rotation, a second shaft of the central hub may be rotated in a direction of translation, such as counterclockwise as illustrated. While this is occurring, a first shaft may be rotated in a first direction opposite the second, which may cause the arms to recess back towards a beginning location as illustrated. As noted previously, depending on the type of linkages used, the stated directions of rotation may actually be describing either direction of rotation to accommodate the movement illustrated relative to the linkage type used.

Figure 5C:
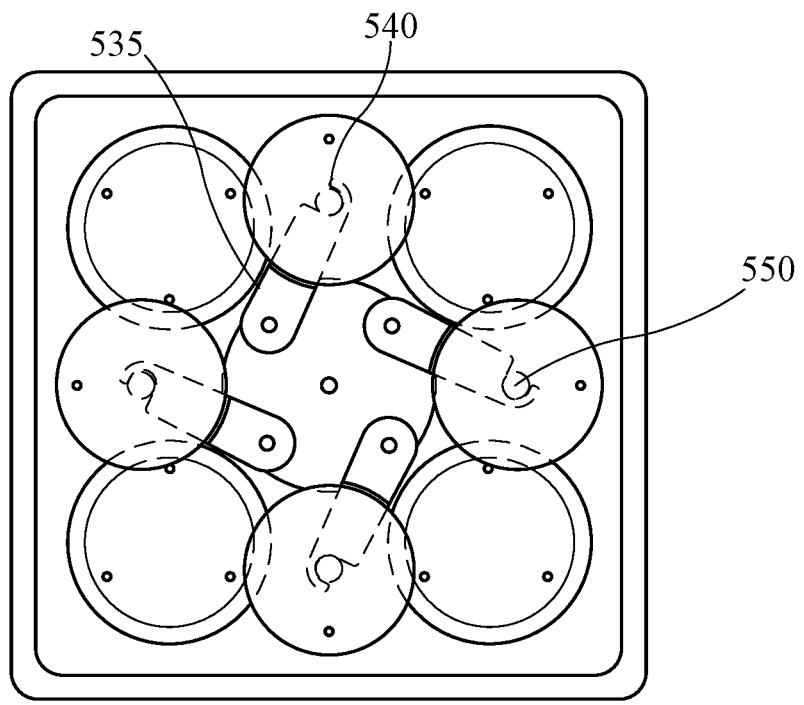
Figure 5D:
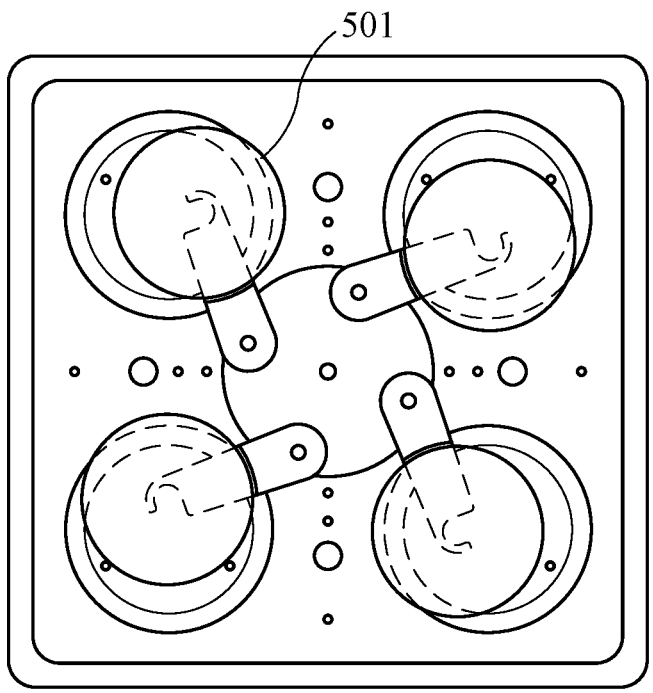

The counter rotations may occur to any position or degree, which may narrow an envelope within which the rotation may occur. Subsequently, translation of the substrate or substrates may proceed at operation 425, where arm 535 and the housing 530 may be co-rotated about the second direction at a common rate or common ratio towards second substrate support 510*b*. As illustrated, the co-rotation may occur along the second direction about the central axis. Consequently, the direction of rotation of the first shaft may be reversed, while the rotation of the second shaft may continue in the same direction as used for engagement. Of course, if translation of the substrate proceeded along the first direction, the directions of the shaft rotation would be the opposite as well. Arms 535 rotating about separate radially offset axes from housing 530 may further facilitate a more direct translation of substrates between substrate supports as illustrated in FIGS. 5B-5D. For example, a substantially linear path, or any degree of arcuate or angled travel may be provided by the present technology by coordinating rotation of the shafts of the transfer apparatus. By providing a linear path in some embodiments that may directly laterally transfer substrates from a first substrate support to a second substrate support, such as in a straight line between a center of a first substrate support and a second substrate support, reduced translation times may be provided, which when scaled to hundreds or thousands of operations may substantially reduce queue times over conventional technologies.

As previously noted, substrate processing systems according to embodiments of the present technology may have monitoring and alignment systems, including an alignment hub 540 positioned between each pair of substrate supports. Additional access port 542 may allow a camera or laser to impinge on the substrate to identify misalignment, which could be based on a notch or other identifier on the substrate. In some embodiments an optional alignment operation may be performed on each of the substrates at optional operation 430. As illustrated in FIG. 5C, the substrate may be transferred to a substrate receiving surface 550 of an alignment hub 540, which may be facilitated by a profile of arm 535. As illustrated, a distal portion of the arm on which the substrate is supported may be characterized by a hook, fork, or aperture through which alignment hub 540 may extend. The alignment hub 540 may be raised to transfer the substrate, or the substrate may be lowered to the substrate receiving surface 550 of alignment hub 540 in different embodiments. Regardless, one or more of the aligners, depending on how many substrates are being translated, may receive the substrate. An alignment adjustment may be performed, and the transfer apparatus may re-engage the substrates.

Figure 5E:
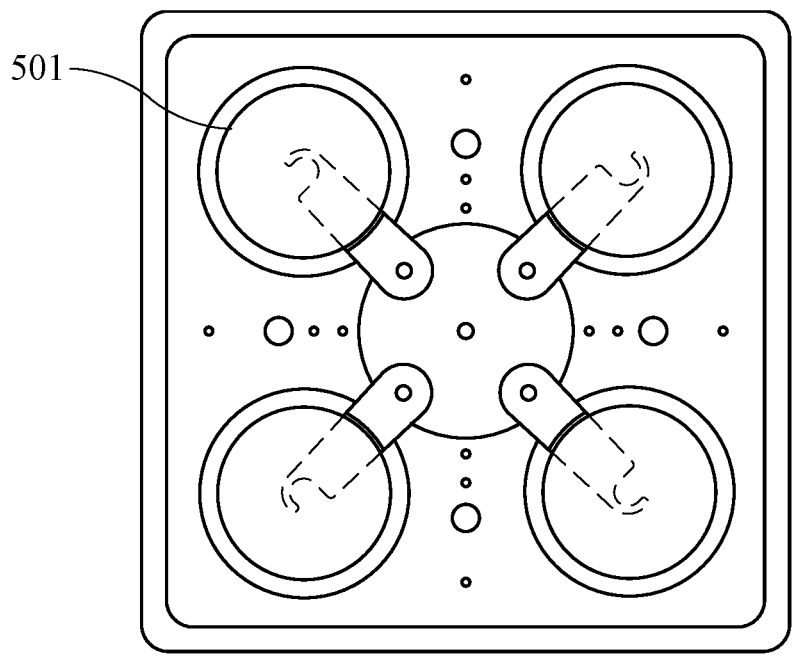

As illustrated in FIG. 5D, the transfer apparatus may continue to rotate the substrates towards a substrate support to which the substrate 501 is to be delivered. Although illustrating a transfer to an adjacent substrate support in a counterclockwise direction, it is to be understood that delivery to any other substrate support in either rotational direction may similarly be performed. At operation 435 the substrate may be delivered to a second substrate support as illustrated in FIG. 5E, which may include extending arms 535 back out by reversing the rotation of the first shaft. As housing 530 continues to rotate, the arms may be withdrawn from a substrate support, and thus in some embodiments the arms may be extended outward proximate a desired delivery location to accommodate a lateral translation path with a rotational housing track. Once delivered, the transfer apparatus may disengage the substrate from the transfer apparatus. Again, the substrate may be lowered with the transfer apparatus, and/or the substrate support, or lift pins of the substrate support may engage the substrate to accept the substrate from the transfer apparatus. As will be described below the substrates may be individually disposed on the respective substrate supports, which may facilitate further alignment of the substrates.

For example, because the substrate supports or lift pins may accommodate individual delivery of the substrates, the transfer apparatus may perform additional alignment maneuvers before delivering the substrate. For example, while translating the substrate, a camera or monitoring system as previously described may identify an offset of the substrate, which may cause the substrate to contact a pocket of a substrate support into which the substrate will be delivered. The monitoring system may provide feedback through an associated control system, which may direct further maneuvers of the transfer apparatus. Although discrete lateral movements along an xy-plane parallel to a surface of the substrate support may be limited due to the rotational nature of the transfer apparatus, these movements may still be performed. By further rotating one or both of the housing or the arms, the intersecting arc paths may be modified to laterally adjust the position of the substrate prior to delivery. Because each lift pin set may be vertically offset from each other lift pin set as will be further illustrated below, this modification may be performed for one or more including each substrate of the system.

Figure 5F:
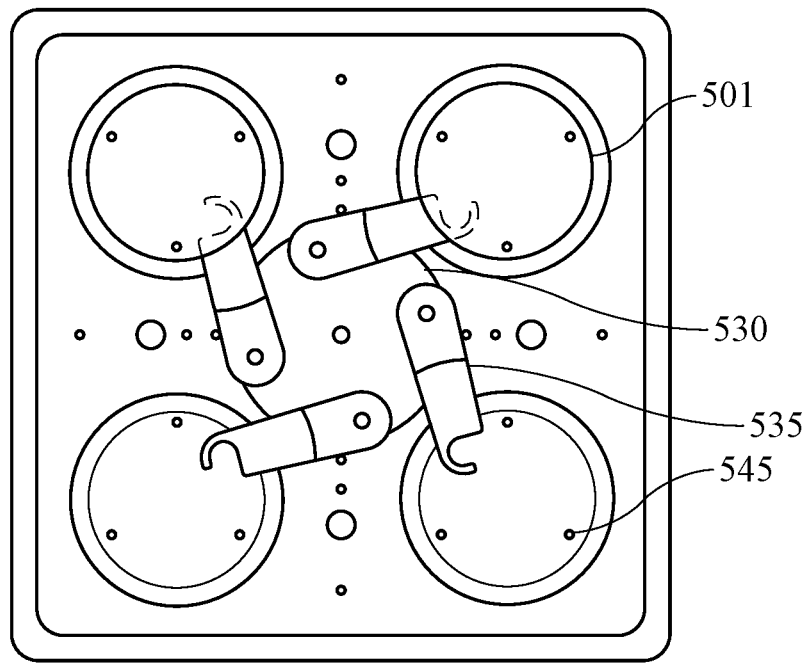

Once each substrate has been delivered to a respective substrate support, the transfer apparatus may be transitioned out from between substrates and the substrate supports. The present technology may also accommodate lift pins associated with the substrate supports. FIG. 5F illustrates only two substrates 501 for ease of explanation with two other bare substrate supports showing lift pin sets 545, which may be extending between a substrate and substrate support, and which may be avoided by the transfer apparatus subsequent delivery of the substrate. While translation and delivery may be performed laterally as described previously, the delivery may include raising lift pins, or lowering the transfer apparatus, which may bring the lift pins in line with the transfer path. Accordingly, transitioning the transfer apparatus away from the substrate supports may involve additional movements.

As illustrated in FIG. 5F, transitioning the transfer apparatus may involve continuing to rotate the second shaft in the second direction while more actively rotating the first shaft in the first direction, which may draw the arms 535 inward toward the central hub. As illustrated, this motion may recess the arms away from lift pins which may be positioned on either side of the arm after delivery. Additionally, the rotation may occur in either direction, although the rotation may be performed towards a feature of the arms as illustrated. Although any number of arm profiles and geometries are encompassed by the present technology, the hook illustrated may shorten a leading edge of the arm in the second direction, which may further facilitate avoiding contact with the lift pin as illustrated.

Figure 5G:
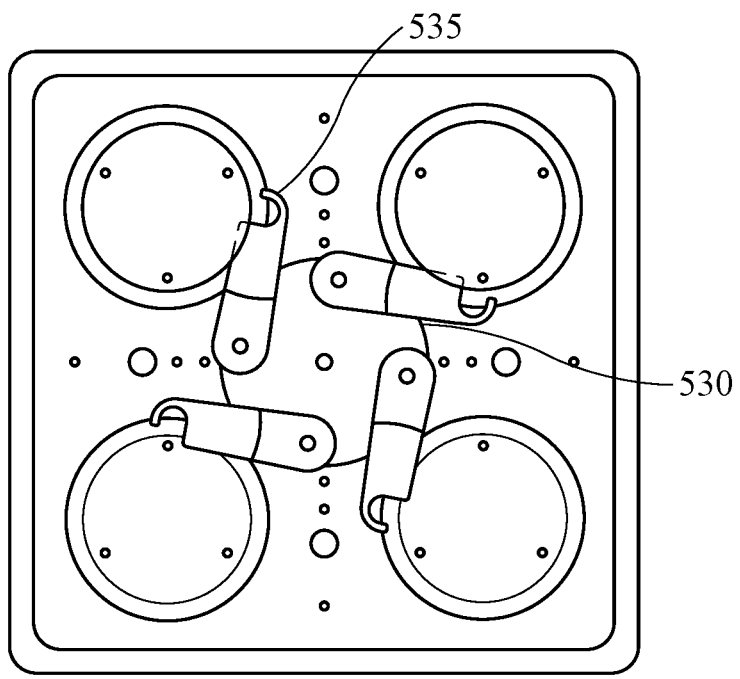
Figure 5H:
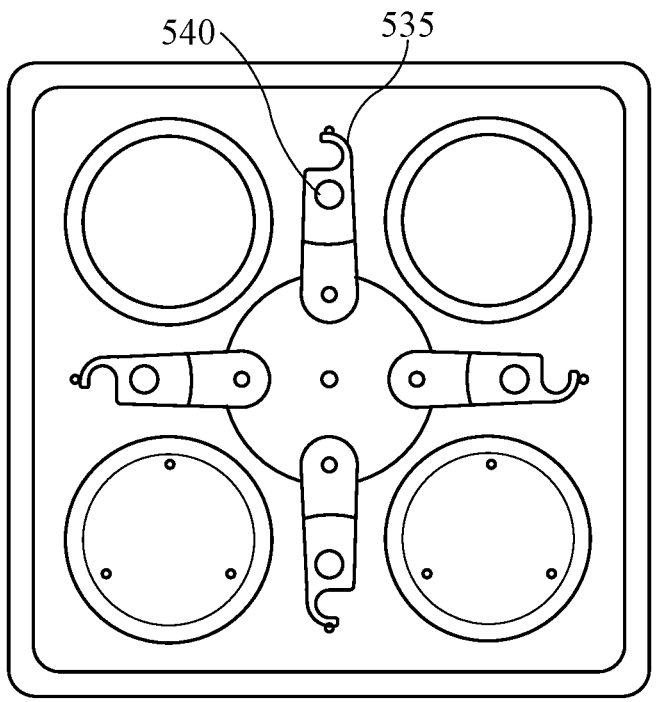

The recessing may continue to nest the arms proximate the housing during processing, although in some embodiments the arms may be recessed between substrate supports. Once the arms have been initially recessed as shown, the transitioning may also include rotating the second shaft back in the first direction. During the initial rotation, the first shaft may be rotated to maintain the recession of the arms 535, which may include rotating the first shaft with the second shaft in the first direction as shown in FIG. 5G. Subsequently, the first shaft may be rotated in the opposite direction from the second shaft to extend the arms 535 outward as illustrated in FIG. 5H. For example, as illustrated the first shaft may be rotated in the second direction while the second shaft may be rotated in the first direction to extend the arms outward, which may position the arms in a holding position during substrate processing. Additionally, such a position may align the arms 535 over the alignment hub 540 when included, which may provide protection for the alignment hub against particle accumulation, for example.

Figure 6:
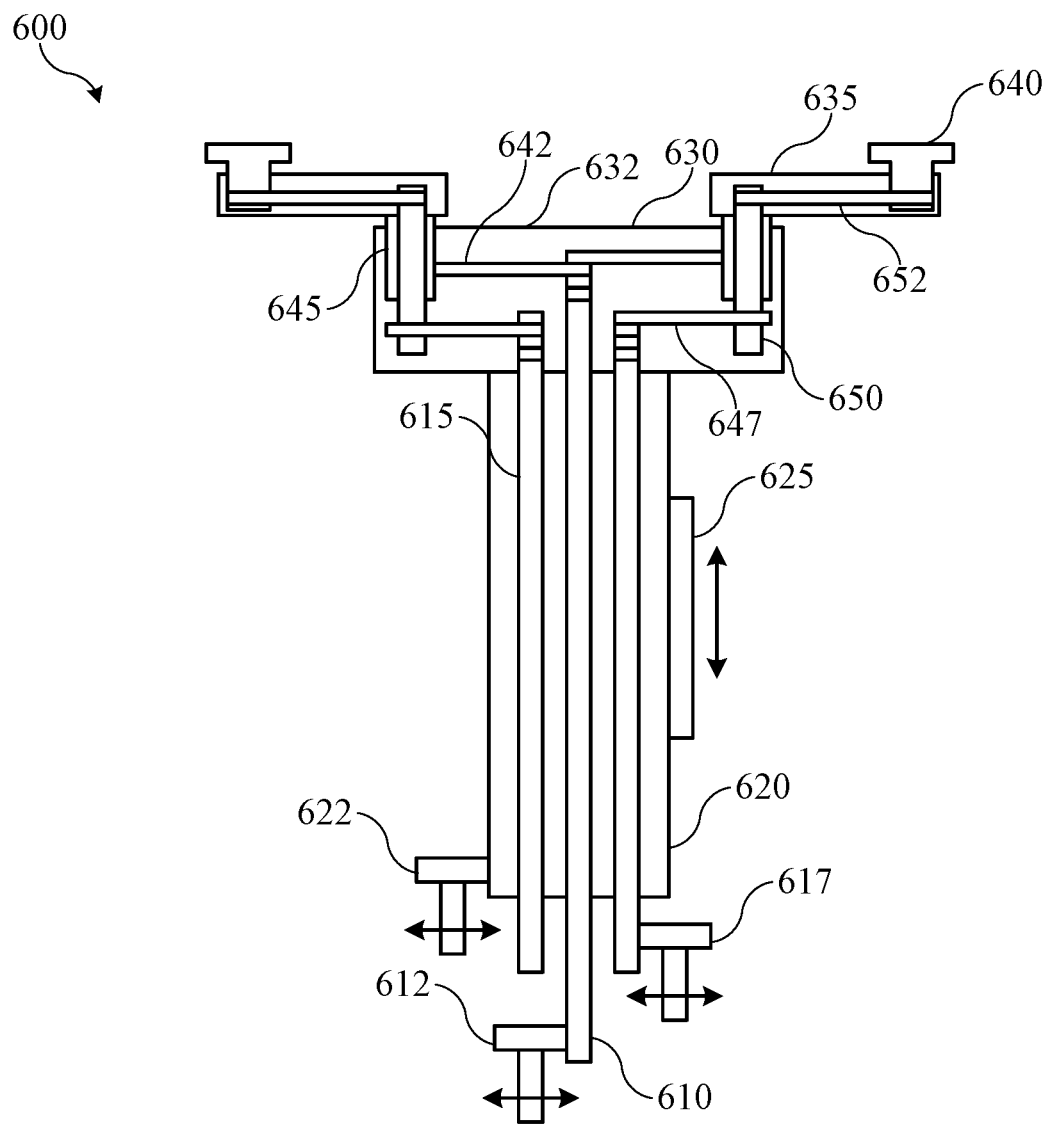
FIG. 6 shows a schematic cross-sectional view of an exemplary transfer apparatus according to some embodiments of the present technology.

FIG. 6 shows a schematic cross-sectional view of an exemplary transfer apparatus 600 according to some embodiments of the present technology. Transfer apparatus 600 may include an additional aligner component as previously described, which may further perform rotational alignment operations during transfer. Consequently, unlike alignment hub 540 described above, an integrated aligner on the transfer apparatus may further reduce transfer times. For example, as a substrate is translated over a monitoring device as previously described, information may be provided back to the transfer apparatus to instruct a rotational alignment adjustment, which may be performed during the translation. This may remove an additional disengagement and engagement operation be removing the alignment hub transfer, which may further control minute offsets that may occur during transfer, and may provide increased accuracy of substrate alignment over conventional technology.

Transfer apparatus 600 may include any of the components, materials, configurations, or characteristics of any other transfer apparatus described elsewhere, and may show a simplified schematic to illustrate a possible coupling of an alignment component. Transfer apparatus 600 may be incorporated in any of the transfer regions as previously described including any number of substrate supports, such as or including transfer region housing 205 including substrate supports 210, and transfer apparatus 600 may include common components with previously noted configurations. For example transfer apparatus 600 may include a central hub 630 including a housing 632, which may define an internal housing volume, and a plurality of arms 635 extending outward from the housing as previously described. In any of the examples of the present technology a housing may not be included, although including a housing may protect components disposed in the internal volume from exposure to effluents or other processing materials, as well as facilitate cooling, by creating a separated volume. Central hub 630 may include a first shaft 610, a second shaft 615, and a third shaft 620. The shafts may be coaxial about a central axis through central hub 630. For example, second shaft 615 may extend about and be concentric with first shaft 610, and third shaft 620 may extend about and be concentric with second shaft 615. Each of the first shaft 610, second shaft 615, and third shaft 620 may be configured to allow independent rotation of a different element of the transfer apparatus.

For example, housing 632 may be coupled with third shaft 620, and may be rotatable about the central axis with third drive system 622, which may include any number of motors or drivers, similar to any other systems described elsewhere, and which may allow rotation in either direction about the central axis. A plurality of arms 635 may be coupled about an exterior of the housing 632, and may include any of the features or characteristics of arms described previously. The arms may be coupled near the housing at a proximal end of the arms, and a distal end of each arm may support an aligner 640 of a plurality of aligners. The couplings for the arms and aligners may include any number of linkage schemes as previously described, and the following example is included merely to facilitate understanding of the independent rotational control of the components regardless of the specific linkage mechanism or mechanisms used.

First shaft 610 may be coupled with a plurality of arm hubs 645 as previously described. Arm hubs 645 may be at least partially disposed within the internal housing volume, although a portion of the arm hubs or an extension of the arm hubs may extend through the housing to couple with arms 635. Each arm hub of the plurality of arm hubs may be coupled with an arm of the plurality of arms as previously described. The arm hubs may be coupled with first shaft 610 by linkages 642, which may include any of the linkages or mechanisms previously described. First shaft 610 may be operatively coupled with first drive system 612, which may facilitate the independent rotation of the first shaft 610, and which may provide rotational capabilities for the arms 635.

In some embodiments each arm 635 may define an internal arm volume, which may allow coupling access to aligners 640, although in some embodiments the coupling may be performed above or below and along an exterior of each arm 635. However, by providing an internal arm volume, the linkages may be protected from exposure to processing materials, and may at least partially reduce heat exposure of the components. A plurality of aligner hubs 650 may be included in the internal housing volume, and may be coupled with second shaft 615 with linkages 647. The aligner hubs 650 may be concentric with the arm hubs 645 as illustrated, and in some embodiments the aligner hubs 650 may extend through arm hubs 645 into the internal arm volume. Accordingly, in some embodiments no portion of the aligner hubs 650 may be exposed within a transfer region environment. The aligner hubs 650 may be coupled with second shaft 615 at a first end with linkages 647. At a second end of the aligner hubs 650 opposite the first end, linkages 652 may further couple the aligner hubs with aligners 640. Second shaft 615 may be operatively coupled with second drive system 617, which may facilitate independent rotation of the second shaft 615, and which may provide rotational capabilities for the aligners 640.

In some embodiments a vertical translation drive 625 may be included, which may allow the transfer apparatus to be vertically translated along the central axis. This may facilitate lifting substrates from substrate supports or lift pins in some embodiments, although in some embodiments the lift pins and/or substrate supports may be used to raise and lower substrates, and transfer apparatus 600 may not include a vertical drive mechanism. By incorporating a third shaft and drive system as illustrated, an additional rotational degree of freedom may be provided that may facilitate an alignment operation of a substrate being transferred, and may further reduce queue times by combining an alignment capability with a translation capability.

Figure 7:
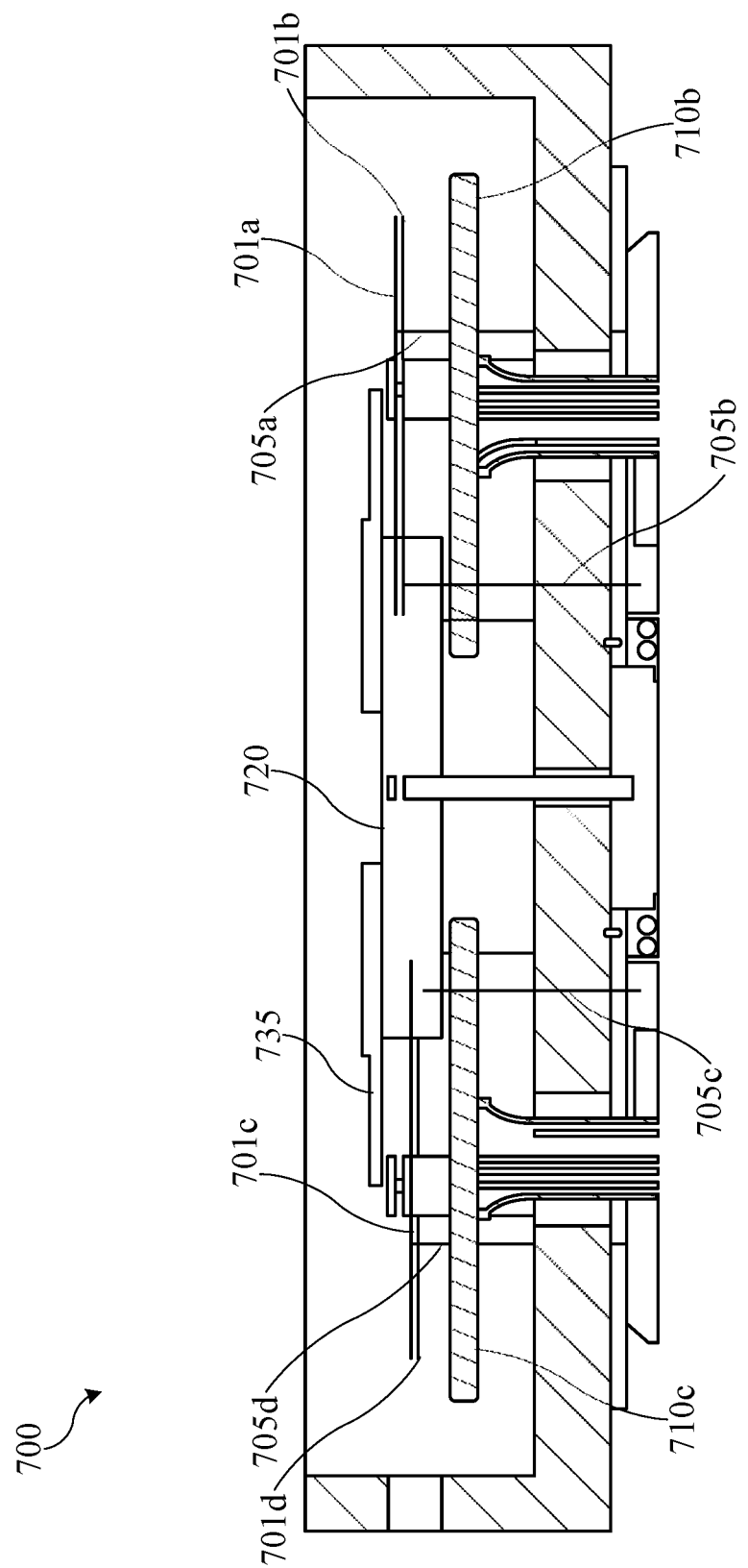
FIG. 7 shows a schematic cross-sectional elevation view of a transfer section of an exemplary substrate processing system according to some embodiments of the present technology.

FIG. 7 shows a schematic cross-sectional elevation view of an exemplary substrate processing system 700 according to some embodiments of the present technology. FIG. 7 illustrates a staggered lift pin configuration as previously described, and as may be included in any of the transfer regions or substrate processing systems previously described. For example, any of the lift pins described previously may include staggered height lift pins as illustrated. Substrate processing system 700 may include any of the components, configurations, and characteristics of any of the previously described embodiments, and similarly any previously described system may include the lift pin configuration illustrated. System 700 may include a plurality of substrates 701 individually positioned on sets of lift pins 705 within the chamber, which may also include a transfer apparatus 720, which may include features of any of the transfer apparatuses previously described, including arms 735 extending from the transfer apparatus.

Lift pins 705 may be sets of pins that extend from substrate supports 710 to provide accessibility for delivering or retrieving a substrate 701, and each set may include any number of pins to accommodate a substrate. As illustrated, lift pin sets 705 are staggered at four different heights, which may allow individual delivery and retrieval of substrates. For example, lift pins 705a may extend a first vertical length above a substrate support. Lift pins 705b may extend a second vertical length above substrate support 710b illustrated in the cross-section, and which may hide a substrate support from which lift pins 705a may extend, although the substrate supports may be in line. The second vertical length may be less than first vertical length as shown.

Additionally, lift pins 705c may extend a third vertical length from substrate support 710c, and the third vertical length may be less than the second vertical length. Finally, lift pins 705d may extend a fourth vertical length from an associated substrate support, which may be hidden by and in line with substrate support 710c. The fourth vertical length may be less than the third vertical length. By staggering the heights of the lift pin sets, individual adjustments may be made to each substrate prior to delivery or retrieval of the substrates. For example, when disposed on the associated lift pins, substrate 701a may be accessible above substrate 702b, which may be accessible above substrate 702c, and which may be accessible above substrate 702d.

The present technology includes substrate processing systems that may accommodate additional substrate supports that may not otherwise be accessible to centrally located transfer robots as previously described. By incorporating transfer apparatuses according to embodiments of the present technology, multiple substrate supports may be utilized and accessed during substrate processing. When transfer apparatuses include articulating arms that may independently be rotated relative to a substrate housing, two axes of rotation may be provided, which may facilitate repositioning of substrates to limit alignment discrepancy leading to additional edge contact between a substrate and a substrate support. The systems may also provide increased transfer speeds by providing more linear motion between substrate supports, which may also facilitate reduced transfer region sizes.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a substrate" includes a plurality of such substrates, and reference to "the arm" includes reference to one or more arms and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate processing system comprising:
a transfer region housing defining a transfer region, wherein a sidewall of the transfer region housing defines a sealable access for providing and receiving substrates;
a plurality of substrate supports disposed within the transfer region;
a plurality of alignment hubs disposed within the transfer region, wherein:
a respective one of the plurality of alignment hubs is positioned between each adjacent pair of the plurality of substrate supports; and
each of the plurality of alignment hubs comprises a substrate receiving surface; and
a transfer apparatus comprising:
a central hub including a first shaft and a second shaft extending about and concentric with the first shaft, the central hub having a housing positioned within the transfer region and coupled with the second shaft, wherein the housing defines an internal housing volume,
a plurality of arms equal to a number of substrate supports of the plurality of substrate supports, each arm of the plurality of arms coupled about an exterior of the housing, and
a plurality of arm hubs disposed within the internal housing volume, each arm hub of the plurality of arm hubs coupled with an arm of the plurality of arms through the housing, wherein the arm hubs are coupled with the first shaft of the central hub.

2. The substrate processing system of claim 1, wherein the plurality of substrate supports comprises at least four substrate supports.

3. The substrate processing system of claim 1, wherein the arm hubs are distributed about a central axis of the central hub proximate a radial edge of the internal housing volume, and wherein the arm hubs are independently rotatable from the housing with which the plurality of arms are coupled.

4. The substrate processing system of claim 3, wherein the first shaft extends within the internal housing volume, wherein one or more linkages couples each arm hub of the plurality of arm hubs with the first shaft within the internal housing volume.

5. The substrate processing system of claim 4, wherein rotation of the first shaft is configured to rotate each arm hub of the plurality of arm hubs simultaneously, wherein each arm hub is characterized by a central axis radially offset from the central axis of the central hub, and wherein rotation of each arm hub of the plurality of arm hubs is configured to rotate a corresponding arm of the plurality of arms about the central axis of an associated arm hub.

6. The substrate processing system of claim 4, wherein the one or more linkages comprises one or more belts extending about each arm hub of the plurality of arm hubs and the first shaft.

7. The substrate processing system of claim 4, wherein the one or more linkages comprises a plurality of gears coupled between the first shaft and the plurality of arm hubs, and wherein each gear of the plurality of gears is disposed between and in contact with both the first shaft and an arm hub of the plurality of arm hubs.

8. The substrate processing system of claim 1, wherein each substrate support of the plurality of substrate supports comprises a set of lift pins accessible through the substrate support, and wherein each set of lift pins is characterized by a different vertical length than each other set of lift pins.

9. The substrate processing system of claim 1, wherein the central hub is vertically translatable along a central axis of the central hub.

10. The substrate processing system of claim 1, wherein the transfer apparatus further comprises a third shaft and a plurality of aligners, each aligner positioned proximate a distal end of an associated arm of the plurality of arms, wherein each aligner is independently rotatable from the plurality of arms and from the housing.

11. The substrate processing system of claim 1, wherein distal portions of each of the plurality of arms are characterized by a hook, a fork, or an aperture through which a respective one of the plurality of alignment hubs may extend.

12. A method of transferring a substrate, the method comprising:
receiving a substrate at a first substrate support within a transfer region of a substrate processing system, the substrate processing system including a transfer apparatus comprising:
a central hub including a first shaft and a second shaft extending about and concentric with the first shaft, the central hub having a housing,
a plurality of arms, each arm of the plurality of arms coupled about an exterior of the housing, and
a plurality of arm hubs, each arm hub of the plurality of arm hubs coupled with an arm of the plurality of arms, wherein the arm hubs are coupled with the first shaft of the central hub;
engaging the substrate with an arm of the plurality of arms;
rotating the first shaft in a first direction about a central axis of the central hub to move the arm of the plurality of arms to recess the substrate towards the housing of the central hub;
rotating the second shaft in a second direction about the central axis of the central hub to rotate the housing of the central hub towards a second substrate support of the substrate processing system;
co-rotating the first shaft and the second shaft in the second direction about the central axis to reposition the substrate to rotate the housing of the central hub, the arm of the plurality of arms, and the substrate towards the second substrate support of the substrate processing system; and
delivering the substrate to the second substrate support of the substrate processing system.

13. The method of transferring a substrate of claim 12, further comprising transitioning the transfer apparatus by further rotating the second shaft in the second direction about the central axis and rotating the first shaft in the first direction about the central axis.

14. The method of transferring a substrate of claim 13, further comprising rotating the first shaft in the second direction about the central axis and rotating the second shaft in the first direction about the central axis.

15. The method of transferring a substrate of claim 12, further comprising, subsequent engaging the substrate, lifting the substrate from the first substrate support by translating the transfer apparatus vertically within the transfer region.

16. The method of transferring a substrate of claim 12, wherein each arm of the plurality of arms further comprises an aligner independently rotatable from the arm, and wherein the substrate is seated on the aligner when the substrate is engaged by the arm of the plurality of arms.

17. The method of transferring a substrate of claim 12, wherein the transfer region includes at least four substrates, and wherein engaging the substrate comprises individually or simultaneously engaging the at least four substrates with the arms of the plurality of arms.

18. The method of transferring a substrate of claim 17, further comprising disengaging the at least four substrates, wherein the disengaging individually or simultaneously deposits the at least four substrates on associated substrate supports.

19. The method of transferring a substrate of claim 12, further comprising, prior to delivering the substrate to the second substrate support, delivering the substrate to an alignment hub positioned between the first substrate support and the second substrate support.

20. A substrate processing system comprising:
  a transfer region housing defining a transfer region, wherein a sidewall of the transfer region housing defines a sealable access for providing and receiving substrates;
  a plurality of substrate supports disposed within the transfer region;
  a plurality of alignment hubs disposed within the transfer region, wherein:
    a respective one of the plurality of alignment hubs is positioned between each adjacent pair of the plurality of substrate supports; and
    each of the plurality of alignment hubs comprises a substrate receiving surface; and
  a transfer apparatus comprising:
    a central hub including a first shaft, a second shaft extending about and concentric with the first shaft, and a third shaft extending about and concentric with the second shaft, the central hub having a housing positioned within the transfer region and coupled with the third shaft, wherein the housing defines an internal housing volume,
    a plurality of arms, each arm of the plurality of arms coupled about an exterior of the housing at a proximal end of the arm,
    a plurality of arm hubs disposed within the internal housing volume, each arm hub of the plurality of arm hubs coupled with an arm of the plurality of arms through the housing, wherein the arm hubs are coupled with the first shaft of the central hub,
    a plurality of aligners, each aligner of the plurality of aligners coupled with an arm of the plurality of arms at a distal end of the arm, and
    a plurality of aligner hubs disposed within the internal housing volume, each aligner hub of the plurality of aligner hubs concentric with an arm hub of the plurality of arm hubs, wherein each aligner hub of the plurality of aligner hubs is coupled with an aligner of the plurality of aligners through the housing, and wherein the aligner hubs are coupled with the second shaft of the central hub.

* * * * *